(12) United States Patent
Yang et al.

(10) Patent No.: US 9,655,276 B2
(45) Date of Patent: May 16, 2017

(54) RACK CONTROL MODULE

(71) Applicant: HEWLETT-PACKARD DEVELOPMENT COMPANY, L.P., Houston, TX (US)

(72) Inventors: Shou-Jen Yang, Taipei (CN); Paul E. Westphall, Tomball, TX (US); Minh H. Nguyen, Katy, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/109,265

(22) PCT Filed: Jan. 30, 2014

(86) PCT No.: PCT/US2014/013959
§ 371 (c)(1),
(2) Date: Jun. 30, 2016

(87) PCT Pub. No.: WO2015/116120
PCT Pub. Date: Aug. 6, 2015

(65) Prior Publication Data
US 2016/0338218 A1   Nov. 17, 2016

(51) Int. Cl.
*H05K 7/02* (2006.01)
*H05K 7/04* (2006.01)
*H05K 7/14* (2006.01)

(52) U.S. Cl.
CPC ......... *H05K 7/1492* (2013.01); *H05K 7/1489* (2013.01)

(58) Field of Classification Search
CPC ........ H05K 1/18; H05K 1/141; H05K 5/0026; H05K 7/1401; Y10T 29/49948; A01B 12/006; F16B 2/10; H01G 4/38; H01G 2/06

USPC ........ 361/728–730, 807, 809, 810, 801–802, 361/752, 759
See application file for complete search history.

(56) References Cited

U.S. PATENT DOCUMENTS

| | | |
|---|---|---|
| 5,949,652 A | 9/1999 | McAnally et al. |
| 5,993,241 A | 11/1999 | Olson et al. |
| 6,040,981 A * | 3/2000 | Schmitt ............... G06F 1/18 312/221 |
| 6,222,736 B1 * | 4/2001 | Sim ................... G06F 1/184 361/727 |

(Continued)

FOREIGN PATENT DOCUMENTS

TW   201124831 A   7/2011

OTHER PUBLICATIONS

"Installing System Components"; Feb. 2, 2012; 45 pages; http://server.ru/html/products/dell/servers/rack/dell-poweredge-r510/guide/install.htm.

(Continued)

*Primary Examiner* — Hung S Bui
(74) *Attorney, Agent, or Firm* — Lakshmikumaran and Sridharan

(57) ABSTRACT

A rack control module including a pair of mounting braces for mounting the RCM on a handle of a power supply unit (PSU). The PSU may be mounted on a server rack. The RCM also includes a latch disposed in proximity to the pair of mounting brace. Upon mounting the RCM on the handle of the PSU, the latch locks the RCM in an engaged position with the handle of the PSU.

13 Claims, 6 Drawing Sheets

(56) References Cited

U.S. PATENT DOCUMENTS

| | | | |
|---|---|---|---|
| 6,843,674 B1 * | 1/2005 | Young | H01R 13/6315 439/248 |
| 7,542,300 B1 | 6/2009 | Lui et al. | |
| 8,743,563 B2 * | 6/2014 | Liang | G06F 1/188 361/802 |
| 8,847,085 B2 * | 9/2014 | Chen | H02J 1/00 174/50 |
| 2007/0188303 A1 | 8/2007 | Faro et al. | |
| 2008/0188197 A1 | 8/2008 | Toth et al. | |
| 2008/0209097 A1 | 8/2008 | Kerrigan | |
| 2009/0147459 A1 * | 6/2009 | Nguyen | G06F 1/188 361/679.31 |
| 2011/0122663 A1 | 5/2011 | Huang | |
| 2011/0136353 A1 | 6/2011 | Spitaels et al. | |
| 2012/0194350 A1 | 8/2012 | Crisp et al. | |

OTHER PUBLICATIONS

"Rack Connection Module and External Power Supplies"; Oct. 14, 2013; 8 pages.
IBM; "Replacing a Power Supply Module"; Oct. 9, 2013; 3 pages.
International Searching Authority, The International Search Report and the Written Opinion, Oct. 23, 2014, 9 Pages.

* cited by examiner

RACK CONTROL MODULE

BACKGROUND

In a typical server rack, multiple hardware devices, such as a server, a power supply unit (PSU), a plurality of data storage devices, and a plurality of network elements are mounted. In such a server rack, the PSU is mounted in a power supply chassis specifically designed to receive and mount the PSU. The PSU is removably secured with the power supply chassis using a retention mechanism, such as a spring loaded lever and a latch. The PSU is electrically connected with a power distribution board (PDB) in the power supply chassis. The PDB distributes power from the PSU to the server though a power management device. A rack connector module (RCM) is coupled to the PDB and the power management device for supporting power management functions of the power management device.

BRIEF DESCRIPTION OF FIGURES

The detailed description is provided with reference to the accompanying figures. In the figures, the left-most digit(s) of a reference number identifies the figure in which the reference number first appears. The same numbers are used throughout the figures to reference like features and components.

DETAILED DESCRIPTION

Figure 1A:
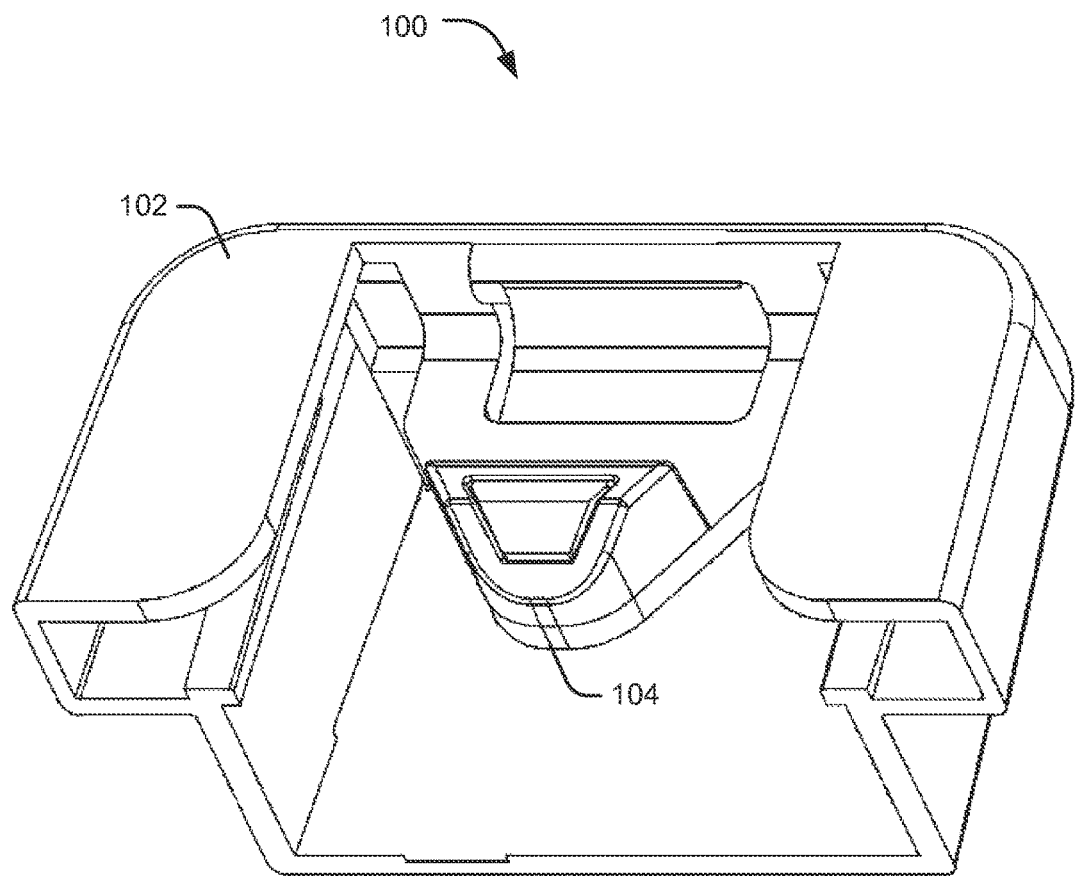
FIGS. 1a and 1b schematically illustrate an example rack control module (RCM), in accordance with an example of the present subject matter.

A rack control module (RCM) for supporting power distribution from a power supply unit (PSU) in a server rack is described herein. In the server rack, a plurality of hardware devices, such as a server, the PSU, data storage devices, and network elements are stacked together to minimize floor space and to simplify cable connections between such hardware devices. The server rack includes multiple chassis designed specifically for mounting the hardware devices in the server rack. One such chassis is a power supply chassis for mounting the PSU and a power distribution board (PDB) adjacent to the PSU in the server rack. The PDB is electrically connected with the PSU for distributing power to the hardware devices.

Generally, to manage power distribution to the server, a power management device is connected with the server and the PDB. The power management device performs power management functions, such as server level power on and off, server power metering, dynamic power capping, and asset management capabilities to enable a user to control power distribution to the server. An example of such a power management device includes an SL Advanced Power Manager (SLAPM) which is a compact power management hardware device generally used with server racks. The PDB is connected to the power management device through the RCM which supports power management functions of the power management device.

The RCM is an L-shaped member which is securely attached to a side wall and a base wall of the power supply chassis using a securing mechanism, such as screws. The RCM is securely attached to the power supply chassis after mounting the PSU and a redundant PSU in the power supply chassis. The RCM includes an internal RCM connector which is electrically connected to with PDB in the power supply chassis through a ribbon cable. The RCM further includes an external RCM connector which is electrically connected with the internal RCM connector. The external RCM connector is further electrically connected with the SLAPM through another ribbon cable. Thus, an electrical path is defined between the PDB and the SLAPM by the ribbon cables connected by the internal RCM connector and the external RCM connector of the RCM.

However, as the RCM is securely attached to the side wall and the base wall of the power supply chassis, a PSU of higher power having a length longer than the base wall of the power supply chassis cannot be mounted in the power supply chassis. Further, the ribbon cable connecting the RCM and the PDB is disposed on the base wall of the power supply chassis. As such, during insertion or removal of the PSU from the power supply chassis, the ribbon cable may crumple making it susceptible to damage. In some cases, due to the crumpling, the ribbon cable may get severed thereby resulting in either poor electrical connection or a loss of electrical connection. In some cases, the ribbon cable may further be protected by way of a plastic cover that encloses the ribbon cable. In such a case, due to the crumpling, the plastic cover on the ribbon cable may erode to a point where the wires inside the ribbon cable become exposed, which may result in short-circuiting of the ribbon cable.

When the ribbon cable is soldered to the internal RCM connector of the RCM, in case of damage, the entire ribbon cable along with the RCM would be replaced. Also, the RCM is to be removed for insertion or removal of a redundant PSU as a handle of the redundant PSU is blocked by the RCM which is securely attached to the side wall of the power supply chassis. As such, the process of insertion or removal of the redundant PSU becomes time consuming. Additionally, due to lack of a provision for safe keeping of the RCM removed during removal of the PSU, chances of accidental damage or loss of the RCM is considerably increased.

A rack control module (RCM) for supporting power distribution from a power supply unit (PSU) in a server rack is described. As per one example, the RCM as described may ease insertion or removal of the PSU. The server rack is used for mounting together a plurality of hardware devices, such as a server, the PSU, a plurality of data storage devices, and a plurality of network elements. As such, the amount of floor space may be reduced, and cable connections between such hardware devices may be minimized.

As mentioned previously, the server rack may include a plurality of chassis specifically designed for mounting different hardware devices in the server rack. Examples of such chassis include power supply chassis, fan chassis, data storage chassis, server chassis, and so on. The power supply chassis is designed specifically for mounting the PSU in the server rack. The PSU includes power supply circuitry which converts alternating current (AC) power obtained from an AC mains switch through an AC power cable to a direct current (DC) power suitable for use by the hardware devices. The DC power from the PSU is then distributed by a power distribution board (PDB), mounted in the power supply chassis along with the PSU, to the hardware devices.

For managing the power distribution from the PDB to the server, a power management device is connected with the server and the PDB. The power management device is mounted on the server rack in the power supply chassis along with the PDB and the PSU. The power management device provides functions, such as server level power on and off, server power metering, dynamic power capping, and asset management capabilities so as to enable a user to better control power distribution to the server.

Typically, the PSU and the PDB are mounted in the power supply chassis such that the PSU and the PDB are adjacent to each other. In an example, the PSU may be mounted on a front side of the power supply chassis and the PDB may be mounted on a rear side of the power supply chassis. Upon mounting, the PDB and the PSU are removably secured to a base wall of the power supply chassis. The PDB may be removably secured to the base wall of power supply chassis using securing mechanism, such as screws. The PSU may be removably secured to a side wall of power supply chassis using retention mechanism, such as a spring loaded lever and a latch. In an example, the retention mechanism may be provided on the PSU such that the PSU is removably secured with the side wall of the power supply chassis. The RCM, according to an example of the present subject matter, may then be mounted on a handle of the PSU such that the RCM engages with the handle of the PSU.

In one example, the RCM includes a pair of mounting braces for mounting the RCM onto the handle of the PSU. The pair of mounting braces may compliment the shape of the handle of the PSU. In another example, the RCM may be shaped such that the pair of mounting braces may easily engage with the handle of the PSU. The RCM may include a latch for locking the RCM with the handle of the PSU once the pair of mounting braces have engaged with the handle of the PSU. Once mounted and engaged, the latch may lock the RCM in an engaged position with the handle of the PSU.

In one example, the RCM further includes an internal flexible printed circuit (FPC) connector which is fixedly coupled to the RCM. In one example, the internal FPC connector may be selected depending on a size of the RCM. The internal FPC connector is further detachably coupled with one end of a flat flexible cable (FFC). Another end of the FFC is coupled to the PDB in the power supply chassis such that the FFC provides an electrical connection between the RCM and the PDB. The FFC is further affixed along a length of the FFC on a surface of the base wall of the power supply chassis by using an affixing member applied to the surface of the base wall of the power supply chassis. As such, the FFC provides a mechanical connection between the RCM and the PDB in addition to providing the electrical connection between the RCM and the PDB.

Further, the RCM may include a strap aperture on a rear side of side of the RCM. The strap aperture is located between the pair of mounting braces such that when the RCM is mounted on the handle of the PSU, the strap aperture exposes a portion of the handle of the PSU. The strap aperture may allow a harnessing member to be coupled to the handle of the PSU and the RCM. The harnessing member may be used for fastening a connecting member with the strap aperture.

Furthermore, the RCM includes an external RCM connector operably coupled with the internal FPC connector. In one example, the external RCM connector and the internal FPC connector are electrically connected with each other through a printed circuit board. The external RCM connector is further coupled with the power management device through a server connecting mechanism. The server connecting mechanism is detachably coupled with the external RCM connector and the power management device. Therefore, the RCM is coupled to the PDB and the power management device for supporting power management functions of the power management device through an electrical path defined by the FFC and the server connecting mechanism coupled by the internal FPC connector and the external RCM connector of the RCM.

Thus, the RCM according to the present subject matter eases the entire process of insertion or removal of the PSU as the RCM is mounted on the handle of the PSU and is not attached to the power supply chassis. As such, a redundant PSU may be easily mounted on or dismounted from the PSU without necessitating dismounting of the RCM mounted on the handle of the PSU. Also, a PSU of any length may be used as the RCM now mounts on the handle of the PSU and is not attached to the power supply chassis. In an example, a PSU of higher power and having a length longer than the base wall of the power supply may be used as the RCM easily mounts on the handle of the PSU of higher power.

Further, the RCM is detachably coupled with the FFC affixed on the surface of the base wall of the power supply chassis. The affixing of the FFC on the surface of the power supply chassis provides the mechanical connection between the RCM and the power supply chassis. Thus, when the latch is pressed to release the RCM from the engaged position with the handle of the PSU, the RCM may be left coupled to the power supply chassis through the FFC. Therefore, chances of accidental loss or damage to the removed RCM are considerably reduced after the RCM is dismounted from the handle of the PSU.

Furthermore, the affixing of the FFC to the power supply chassis prevents the FFC from being crumpled during insertion or removal of the PSU. As such, the chances of damage to the FFC are considerably reduced. Also, as the FFC is detachably coupled with the internal FPC connector, the RCM or the FFC may be easily replaced. For example, if the RCM is damaged, the RCM is detached from the FFC and is replaced without necessitating a replacement of the FFC along with the RCM.

The manner in which the RCM is implemented shall be explained in detail with respect to FIGS. 1 to 4. While aspects of the described RCM may be implemented in any number of different structures using different materials, the embodiments are described in the context of the following example RCM.

It should be noted that the description and figures merely illustrate the principles of the present subject matter. It will thus be appreciated that various arrangements that embody the principles of the present subject matter, although not explicitly described or shown herein, may be devised from the description and are included within its scope. Moreover, all statements herein reciting principles, aspects, and embodiments of the present subject matter, as well as specific examples thereof, are intended to encompass equivalents thereof.

Figure 1B:
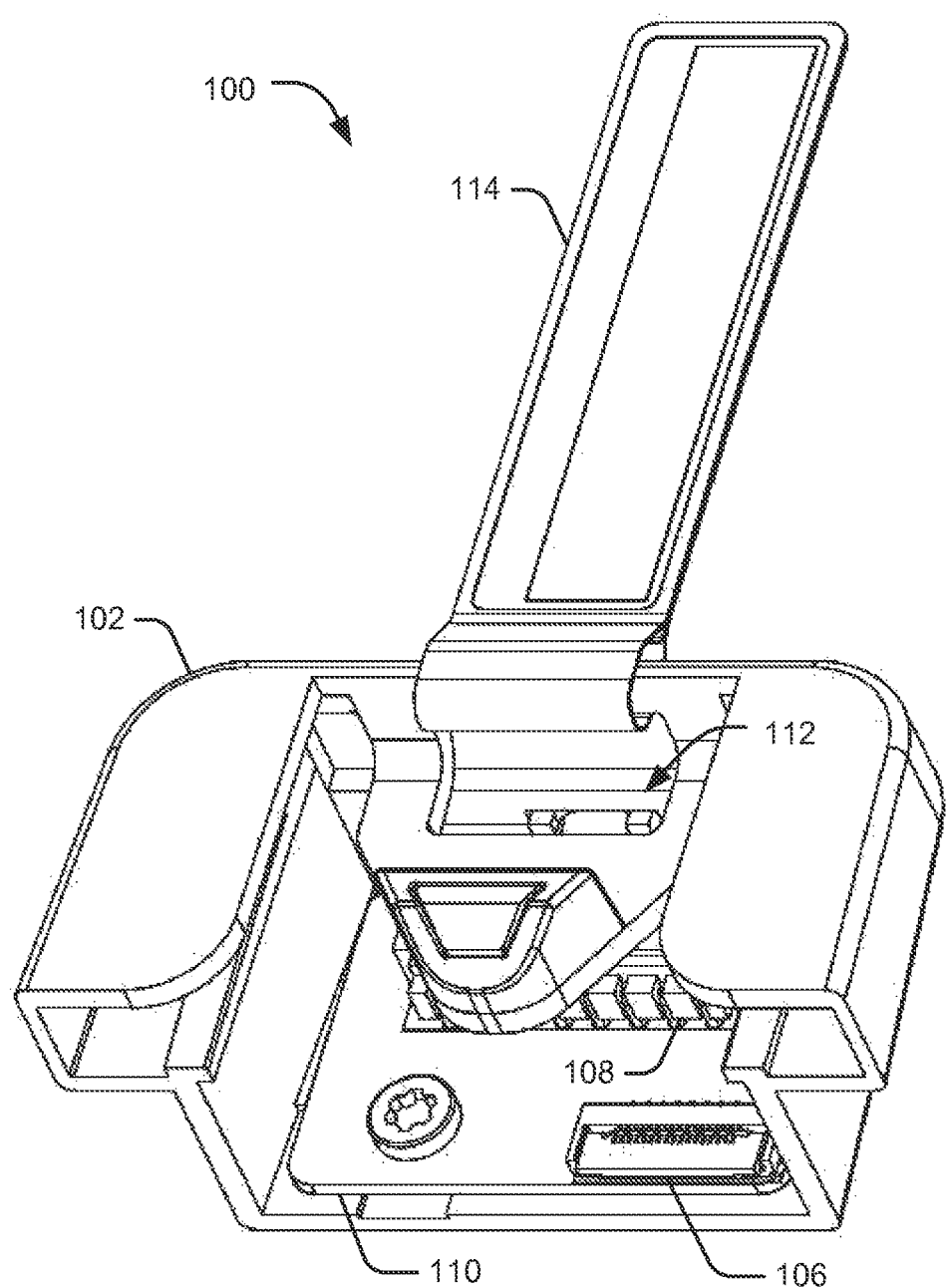

FIG. 1a schematically illustrates an example of a rack control module (RCM) 100, in accordance with one example of the present subject matter. The RCM 100 may include a pair of mounting braces 102 for mounting the RCM 100 on a handle of a power supply unit (PSU) (not shown in the figure). In an example, the pair of mounting braces 102 compliments the shape of handle of the PSU such that the pair of mounting braces 102 easily engage with the handle of the PSU, upon mounting the RCM 100 onto the handle of the PSU. The handle of the PSU may have different shapes according to industry standards or proprietary designs specified for such handles of the PSU. In an example, the pair of mounting braces 102 may compliment the shape of the handle of the PSU according to the different shapes of the handle. The RCM 100 may also include a latch 104 for locking the RCM 100 with the handle of the PSU. After the pair of mounting braces 102 are mounted and engaged with the handle of the PSU, the latch 104 may lock the RCM 100 in an engaged position with the handle of the PSU FIG. 1*b* schematically illustrates the example RCM 100 including various components for distributing power to a server from the PSU, in accordance with one example of the present subject matter. Besides the pair of mounting braces 102 and the latch 104, the RCM 100 may further include an internal flexible printed circuit (FPC) connector 106. The internal FPC connector 106 provides a connection between a power distribution board (PDB) and the RCM 100 (not shown in figure) so as to receive power from the PSU coupled with the PDB. The internal FPC connector 106 is located beneath the pair of mounting braces 102.

It may be understood that the internal FPC connector 106 is an integrated circuit (IC) socket mountable on a printed circuit board. The internal FPC connector 106 provides a mechanical and electrical connection between a cable connected to the internal FPC connector 106 and the printed circuit board. The internal FPC connector 106 may be either a zero insertion force (ZIF) type socket or a non-ZIF type socket. In an example, different sized internal FPC connector 106 may be selected depending upon a size of the RCM 100 that may easily allow the RCM 100 to mount on the handle of the PSU.

The RCM 100 may also include an external RCM connector 108 between the pair of mounting braces 102 on a lower rear side of the RCM 100. It may be understood that the external RCM connector 108 is a socket mountable on a printed circuit board. The external RCM connector 108 provides a mechanical and electrical connection between a cable connected with the external RCM connector 108 and the printed circuit board. In an example, the external RCM connector 108 may be an insulation-displacement connector capable of coupling with a ribbon cable and providing an electrical connection between the ribbon cable and a printed circuit board.

Further, the internal FPC connector 106 and the external RCM connector 108 are operably connected with each other. In one example, the internal FPC connector 106 and the external RCM connector 108 are electrically connected with each other through a RCM board 110. The RCM board 110 is a printed circuit board providing an electrical connection between the internal FPC connector 106 and the external RCM connector 108. In such example, the internal FPC connector 106 and the external RCM connector 108 may be mounted on the RCM board 110. The RCM board 110 may be fixedly secured inside the RCM 100. Through the electrical connection between the internal FPC connector 106 and the external RCM connector 108, the RCM 100 supports the power management functions of a power management device to enable a user to better control power distribution to the server.

Further, the RCM 100 may include a strap aperture 112 disposed between the pair of mounting braces 102 on an upper rear side of the RCM 100. The strap aperture 112 exposes a portion of the handle of the PSU after the RCM 100 is mounted on the handle of the PSU. Additionally, a label 114 may be coupled with the RCM 100 in between the pair of mounting braces 102 through the strap aperture 112.

The label 114 may include instructions about using the RCM 100 in a proper manner. The label 114 may also provide warnings and any other appropriate information in relation to use of the RCM 100. In an example, the label 114 may be affixed on the RCM 100 using an adhesive.

Figure 2:
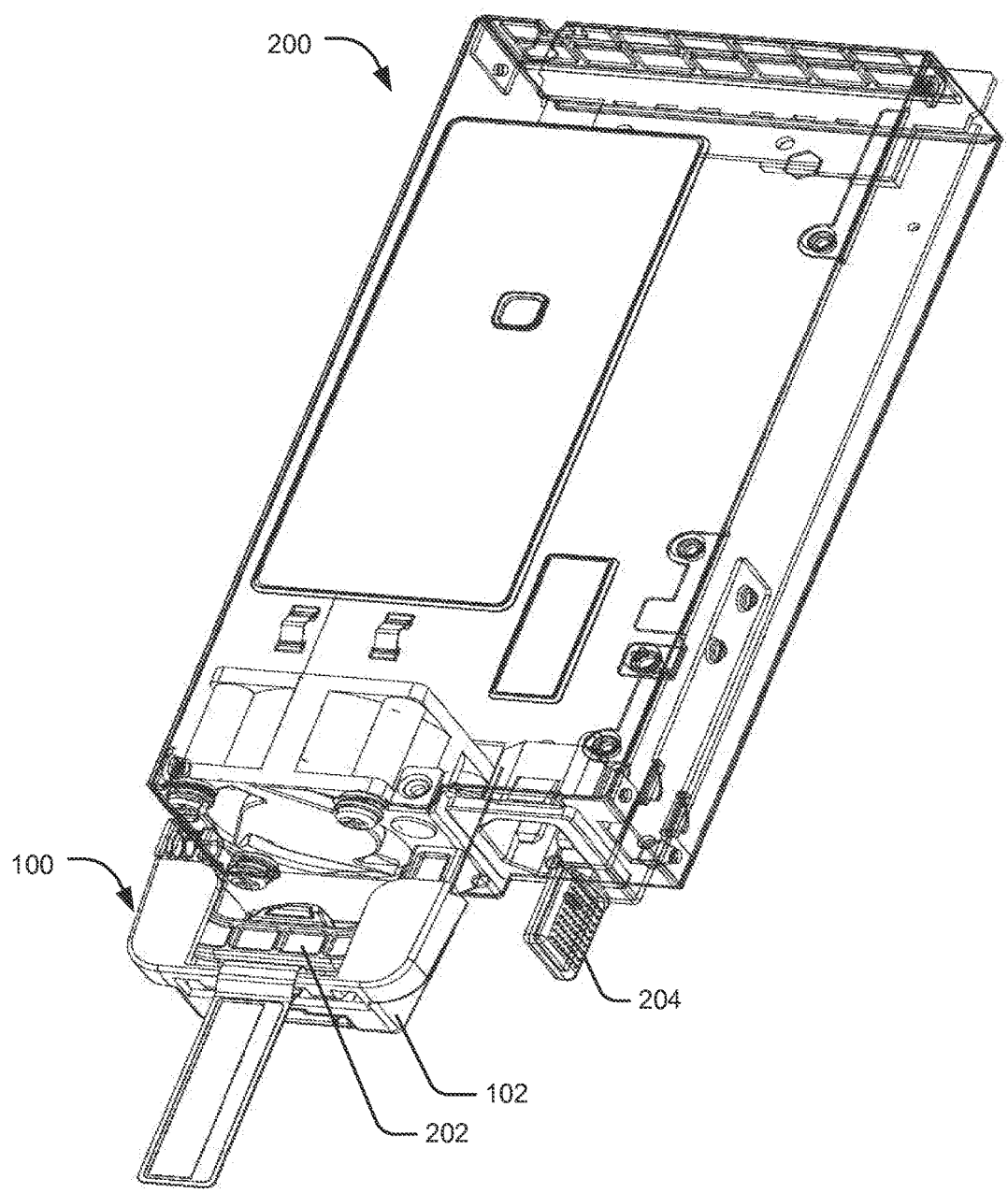
FIG. 2 schematically illustrates the example RCM mounted on a power supply unit (PSU), in accordance with an example of the present subject matter.

FIG. 2 schematically illustrates a PSU 200 with the RCM 100, in accordance with one example of the present subject matter. The PSU 200, as may be understood, includes power supply circuitry (not shown in the figure) which converts alternating current (AC) power to a direct current (DC) power suitable for use by hardware devices, such as a server (not shown in the figure). The PSU 200 further includes a handle 202 for facilitating insertion and removal of the PSU 200 in a power supply chassis (not shown in the figure). The PSU 200 also includes a retention mechanism 204 for removably securing the PSU 200 in the power supply chassis. Upon insertion of the PSU 200 in the power supply chassis, the PSU 200 is removably secured to a side wall of the power supply chassis through the retention mechanism 204. Examples of the retention mechanism 204 include a latch and a spring loaded lever. In an example, the retention mechanism 204 may be provided on the PSU 200.

As described earlier, upon insertion of the PSU 200 in the power supply chassis, the RCM 100 may be mounted on the handle 202 of the PSU 200 by mounting the pair of mounting braces 102 on the handle 202 of the PSU 200. The pair of mounting braces 102 compliments the shape of the handle 202 of the PSU 200 thereby allowing the RCM 100 to engage easily with the handle 202 of the PSU 200. Upon mounting and engaging the pair of mounting braces 102 with the handle 202 of the PSU 200, the latch 104 locks the RCM 100 in an engaged position with the handle 202 of the PSU 200. The latch 104 may be further pressed to release the RCM 100 from the engaged position with the handle 202 of the PSU 200.

Figure 3A:
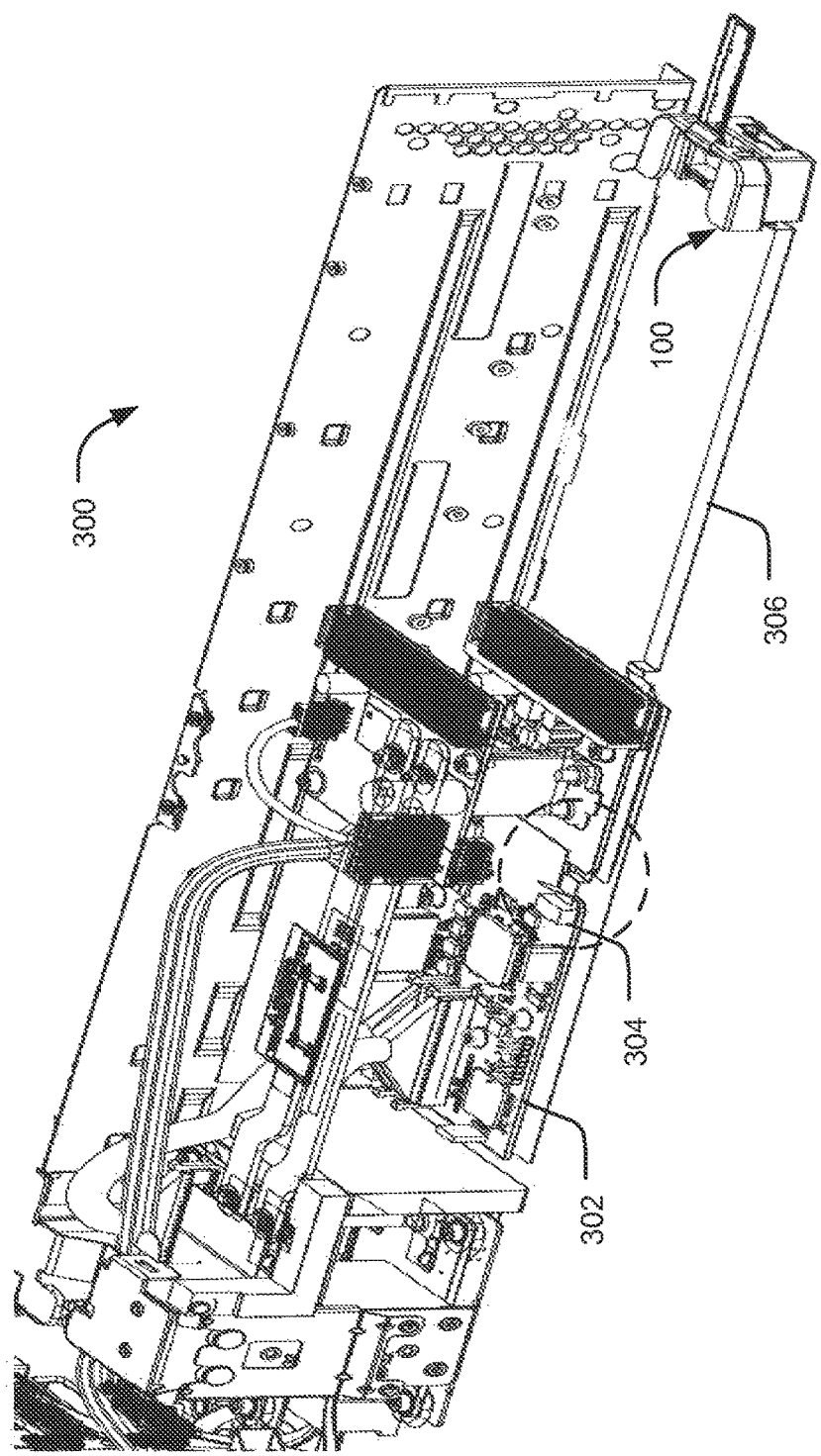
FIGS. 3a and 3b schematically illustrate the example RCM mounted on a power supply chassis, in accordance with an example of the present subject matter.

FIG. 3*a* schematically illustrates a power supply chassis 300 with the RCM 100, in accordance with one example of the present subject matter. The power supply chassis 300 is a specifically designed chassis in a server rack for mounting a PSU (not shown in the figure) and a power distribution board (PDB) 302 in the server rack. In one example, two PSUs may be mounted in the power supply chassis 300 such that one of the PSUs is used as a redundant power supply unit. As described earlier, the PSU converts AC power obtained from an AC mains switch through an AC power cable to DC power suitable for use by hardware devices, such as a server. The PDB 302 is electrically coupled with the PSU for distributing the DC power to the hardware devices.

The PDB 302 and the PSU are mounted on a base wall of the power supply chassis 300 such that the PDB 302 and the PSU are adjacent to each other for facilitating electrical connection between the PDB 302 and the PSU. In an example, the PDB 302 may be mounted on a rear side of the power supply chassis 300 and the PSU may be mounted on a front side of the power supply chassis 300. Upon mounting, the PDB 302 and the PSU are removably secured to the base wall of the power supply chassis 300. The PDB 302 may be removably secured to the base wall of the power supply chassis 300 using securing mechanism, such as screws. The PDB 302 and the PSU may be coupled with electrical cables for facilitating the electrical connection between the PDB 302 and the PSU.

As described earlier, to better manage the power distribution from the PDB 302 to the server, a power management device (not shown in the figure) is connected with the server and the PDB 302. The power management device is mounted in the power supply chassis 300 along with the PDB 302 and the PSU. The power management device provides power management functions to enable a user to better control power distribution to the server. Such power management functions may include, for example, server level power on and off, server power metering, dynamic power capping, and asset management capabilities. An example of one such power management device includes an SL Advanced Power Manager.

Figure 3B:
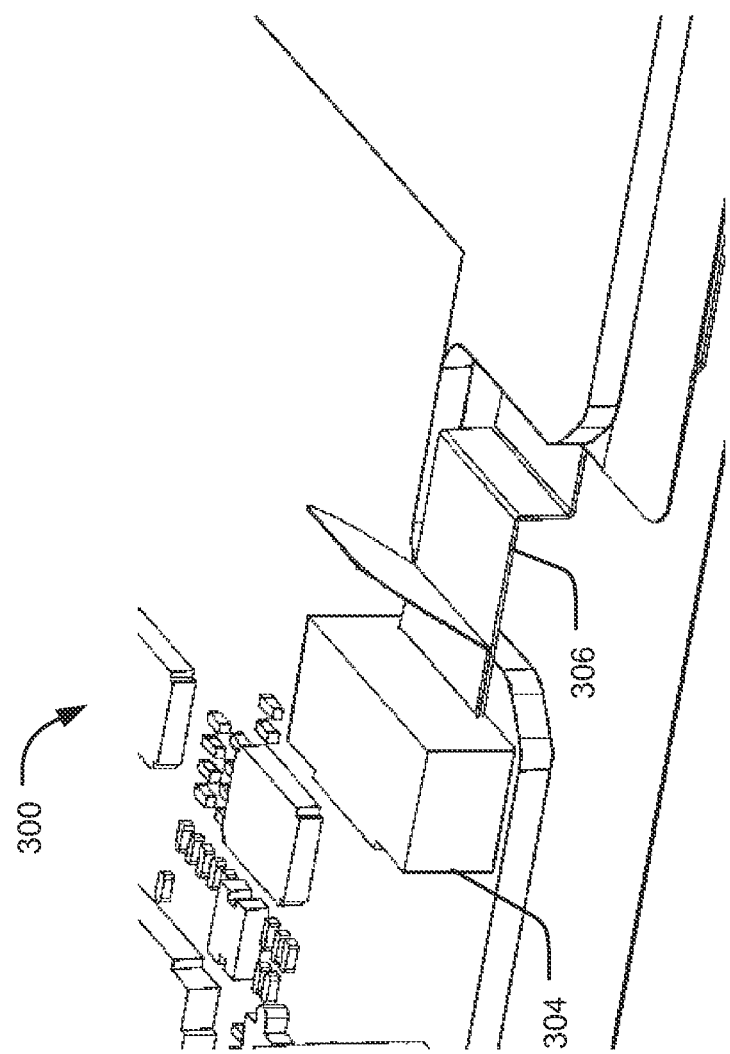

In an example, the PDB 302 may distribute power from the PSU to a server in the server rack through the power management device. The PDB 302 and the power management device are coupled through the RCM 100. The PDB 302 includes an RCM connector 304 for coupling with the RCM 100. In an example, the RCM connector 304 may be an insulation-displacement connector. The RCM connector 304 is coupled with one end of a flat flexible cable (FFC) 306, as shown in FIG. 3b. The FFC 306 is coupled with the RCM connector 304 on the one end through a connector capable of coupling with the RCM connector 304. In an example, the connector on one end of the FFC 306 may be an insulation-displacement connector.

The FFC 306 may be further affixed on a surface of the base wall of the power supply chassis 300 along a length of the FFC 306 by using an affixing member applied to the surface of the base wall of the power supply chassis. In an example, the affixing member may be an adhesive layer applied to the surface of the base wall of the power supply chassis 300. Examples of such adhesive layer include double side plastic tapes and adhesive transfer tapes. In some cases, the FFC 306 may be affixed to the adhesive layer after the adhesive layer is applied to the surface of the base wall of the power supply chassis along the length of the FFC 306. In another example, the affixing member may be a fastening member applied to the surface of the base wall of the power supply chassis 300. One example of such a fastening member includes Velcro. In such an example, the FFC 306 may be affixed to the fastening member after the fastening member is applied to the surface of the base wall of the power supply chassis 300 along the length of the FFC 306. The affixing of the FFC 306 with the base wall of the power supply chassis 300 reduces chance of damage to the FFC 306 during insertion and removal of the PSU as the FFC 306 is prevented from being crumpled or otherwise displaced during insertion and removal of the PSU.

Further, another end of the FFC 306 is detachably coupled with the internal FPC connector 106 in the RCM 100. In one example, another end of the FFC 306 may include either a zero insertion force (ZIF) or non-ZIF electrical connector capable of coupling with the internal FPC connector 106. Thus, the FFC 306 provides a mechanical and an electrical connection between the RCM 100 and the PDB 302 upon coupling with the internal FPC connector 106 in the RCM 100 and with the RCM connector 304 in the PDB 302. Accordingly, when the latch 104 is pressed to release the RCM 100 from the engaged position with the handle of the PSU, the RCM 100 may be left coupled to the power supply chassis 300 through the FFC 306. Therefore, chances of accidental loss or damage to the RCM 100 are considerably reduced after the RCM 100 is dismounted from the handle of the PSU. Also, the detachable coupling of the FFC 306 with the RCM 100 enables individual and easy replacement of either the FFC 306 or the RCM 100 thereby eliminating replacement of both the FFC 306 and the RCM 100. For example, if the RCM 100 is damaged, the RCM 100 is detached from the FFC 306 and replaced without necessitating the replacement of the FFC 306.

As described earlier, the PDB 302 distributes power to the power management device by the RCM 100 through the electrical connection provided by the FFC 306. The power from the PDB 302 is received at the internal FPC connector 106 through the FFC 306. Thereafter, as the external RCM connector 108 and the internal FPC connector 106 are electrically connected with each other, the power from the internal FPC connector 106 is received at the external RCM connector 108 in the RCM 100. The external RCM connector 108 is further coupled with the power management device through a server connecting mechanism (not shown in the figure). Examples of the server connecting mechanism include ribbon cables. The server connecting mechanism is detachably coupled with the external RCM connector 108 and the power management device. Thus, the power from the PDB 302 is thus distributed to the power management device through an electrical path defined by the FFC 306 and the server connecting mechanism coupled with the internal FPC connector 106 and the external RCM connector 108 in the RCM 100.

Figure 4:
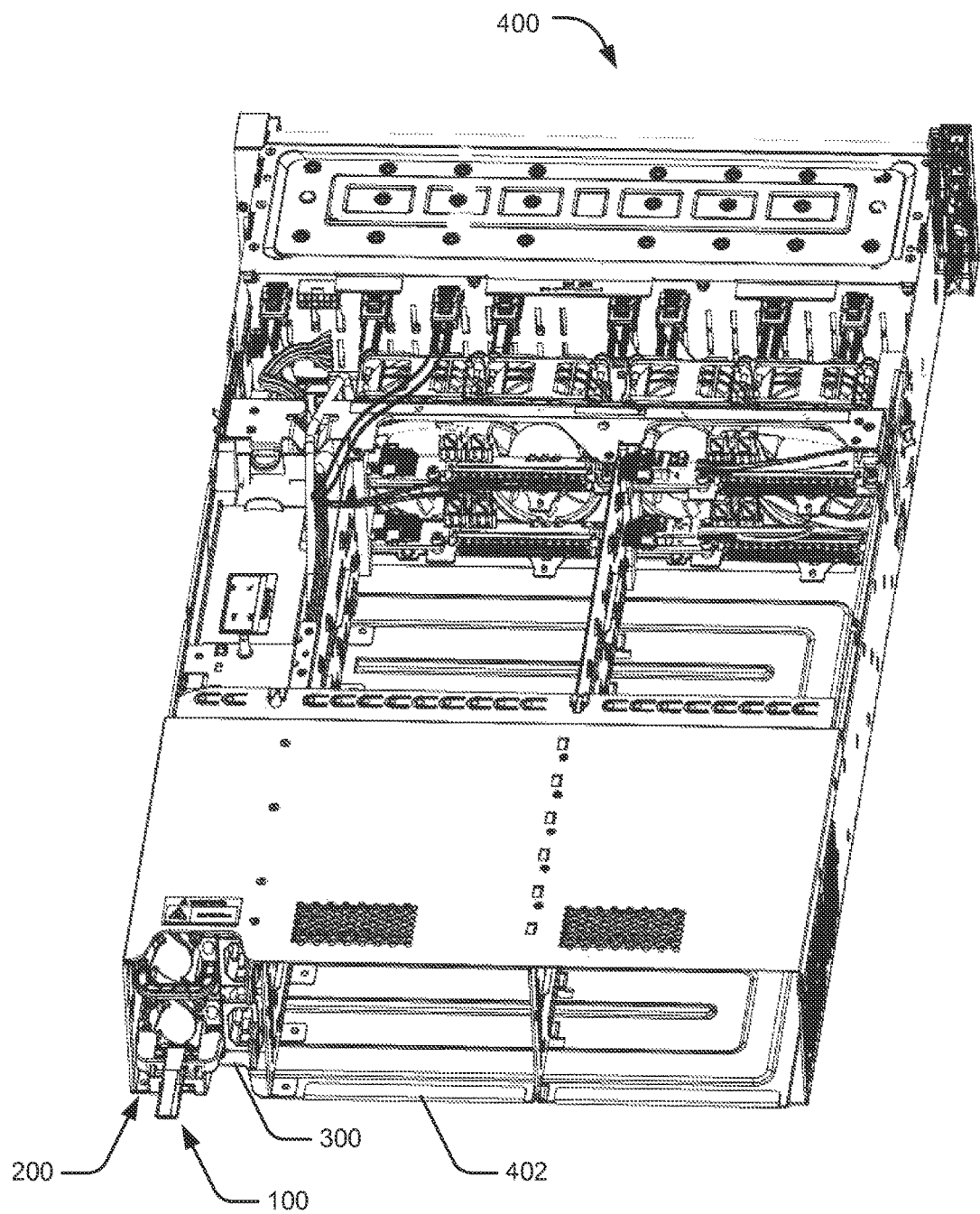
FIG. 4 schematically illustrates an example portion of a server rack including the power supply chassis, the PSU, and the RCM, in accordance with an example of the present subject matter.

FIG. 4 schematically illustrates a portion of a server rack 400 including the power supply chassis 300, the PSU 200, and the RCM 100, in accordance with one example of the present subject matter. In the server rack 400, a plurality of hardware devices, such as a server, a power supply unit (PSU), a plurality of data storage devices, and a plurality of network elements are mounted together. Such mounting of the hardware devices saves floor space and minimizes long cable connections between the hardware devices. The server rack 400 may include the power supply chassis 300 for mounting the PSU 200 and the PDB 302, a fan chassis 402 for mounting a cooling fan, and other chassis for mounting other hardware devices, such as data storage devices and network elements. These chassis are specifically designed for mounting the hardware devices in the server rack 400.

As described earlier, upon insertion of the PDB 302 into the power supply chassis 300, the FFC 306 is coupled with the RCM connector 304 of the PDB 302 and is affixed to the surface of the base wall of the power supply chassis 300 along the length of the FFC 306. Thereafter, the PSU 200 is inserted into the power supply chassis 300 such that the PSU 200 is adjacent to the PDB 302. In an example, a redundant PSU may also be mounted on top of the PSU 200 in the power supply chassis 300. In such example, the redundant PSU may be electrically connected with the PDB 302 so that power may be provided to the PDB 302 without interruption in an event of failure of the PSU 200.

Upon inserting and securing the PSU 200 in the power supply chassis 300, the FFC 306 may be detachably coupled with the internal FPC connector 106 of the RCM. Thereafter, the RCM 100 is mounted on the handle 202 of the PSU 200 through the pair of mounting braces 102. The pair of mounting braces 102 of the RCM 100 compliment the shape of the handle 202 of the PSU 200 and as such easily engage the RCM 100 with the handle 202 of the PSU 200. Upon mounting and engaging, the latch 104 of the RCM 100 locks the RCM 100 in an engaged position with the handle 202 of the PSU 200. Thus, the RCM 100 is securely locked with the handle 202 of the PSU 200. Further, the external RCM connector 108 of the RCM 100 may be detachably coupled with the power management device through the server connecting mechanism. Thus, the electrical path is defined to distribute the power from the PDB 302 to the power management device through the RCM 100.

Furthermore, a harnessing member (not shown in the figure) may be coupled to the handle 202 of the PSU 200 and the RCM 100 through the strap aperture 112. Examples of the harnessing member include Velcro retention straps and cable ties. The harnessing member may be used for securing connecting member with the RCM 100 for preventing accidental damage to the connecting member. Examples of the connecting member include electrical cables, such as power cables and network cables and communicative cables, such as ribbon cables and bus cables. In an example, a Velcro retention strap may be wrapped around the handle 202 of the PSU 200 through the strap aperture 112. In such example, the Velcro retention strap may be used for securing and retaining an AC power cable connected to the PSU 200 for preventing accidental unplugging of the AC power cable.

Although the examples of RCM are described in language specific to structural features, it is to be understood that the appended claims are not necessarily limited to the specific features described. Rather, the specific features and methods are disclosed as examples of the RCM.

We claim:

1. A rack control module (RCM) comprising:
a pair of mounting braces for mounting the RCM on a handle of a power supply unit (PSU), wherein the PSU is mountable on a server rack; and
a latch for locking the RCM in an engaged position with the handle of the PSU, the latch being disposed in proximity to the pair of mounting braces; and
an internal flexible printed circuit (FPC) connector fixedly coupled to the RCM, wherein the internal FPC connector is to detachably couple with one end of a flat flexible cable (FFC).

2. The RCM as claimed in claim 1, wherein the FFC is affixed using an affixing member applied on a surface of the server rack along a length of the FFC.

3. The RCM as claimed in claim 2, wherein the affixing member is an adhesive layer applied on the surface of the server rack along the length of the FFC.

4. The RCM as claimed in claim 2, wherein the affixing member is a fastening member applied on the surface of the server rack along the length of the FFC.

5. The RCM as claimed in claim 1 further comprising a strap aperture on an upper rear side of the RCM and disposed between the pair of mounting braces exposing the handle of the PSU, wherein a harnessing member is coupled to the handle of the PSU through the strap aperture, the harnessing member fastening a connecting member with the strap aperture.

6. The RCM as claimed in claim 1 further comprising an external RCM connector on a rear side of the RCM and disposed at distal end of the pair of mounting braces, the external RCM connector being detachably coupled with a server connecting mechanism, the server connecting mechanism coupling the external RCM connector with a power management device mounted on the server rack, wherein the external RCM connector is operably coupled to the internal FPC connector.

7. A server rack comprising:
a power supply chassis;
at least one PSU enclosed in the power supply chassis; and
a rack control module (RCM) mounted on the at least one PSU in the power supply chassis, the RCM comprising:
a pair of mounting braces for mounting the RCM on a handle of the at least one PSU; and
a latch for locking the RCM in an engaged position with the handle of the at least one PSU, the latch being disposed in proximity to the pair of mounting braces; and
an internal flexible printed circuit (FPC) connector fixedly coupled to the RCM, wherein the internal FPC connector is to detachably couple with one end of a flat flexible cable (FFC).

8. The server rack as claimed in claim 7, wherein an affixing member applied on a surface of the power supply chassis along a length of the FFC is used for affixing the FFC on the surface of the power supply chassis.

9. The server rack as claimed in claim 8, wherein the affixing member is an adhesive layer applied on the surface of the power supply chassis along the length of the FFC.

10. The server rack as claimed in claim 8, wherein the affixing member is a fastening member applied on the surface of the power supply chassis along the length of the FFC.

11. The server rack as claimed in claim 7 further comprising a power distribution board (PDB) enclosed in the power supply chassis, the PDB operably coupled to the at least one PSU, wherein a RCM connector is fixedly coupled to the PDB and is detachably coupled with another end of the FFC.

12. The server rack as claimed in claim 7, wherein the RCM further comprises an external RCM connector on a rear side of the RCM and disposed at distal end of the pair of mounting braces, the external RCM connector operably coupled to the internal FPC connector and detachably coupled to a server connecting mechanism, the server connecting mechanism coupling the RCM and a power management device mounted on the server rack.

13. The server rack as claimed in claim 7, wherein the RCM further comprises a strap aperture on an upper rear side of the RCM and disposed in proximity to the pair of mounting braces exposing the handle of the at least one PSU, wherein the handle of the at least one PSU is coupled to a harnessing member through the strap aperture, the harnessing member fastening a connecting member with the strap aperture.

* * * * *